(12) United States Patent
Van Hove

(10) Patent No.: US 9,252,258 B2
(45) Date of Patent: Feb. 2, 2016

(54) CMOS COMPATIBLE METHOD FOR MANUFACTURING A HEMT DEVICE AND THE HEMT DEVICE THEREOF

(71) Applicant: IMEC, Leuven (BE)

(72) Inventor: Marleen Van Hove, Blanden (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/752,375

(22) Filed: Jun. 26, 2015

(65) Prior Publication Data

US 2015/0295076 A1 Oct. 15, 2015

Related U.S. Application Data

(62) Division of application No. 13/525,644, filed on Jun. 18, 2012, now Pat. No. 9,070,758.

(60) Provisional application No. 61/498,951, filed on Jun. 20, 2011, provisional application No. 61/526,107, filed on Aug. 22, 2011.

(51) Int. Cl.
*H01L 29/00* (2006.01)
*H01L 29/778* (2006.01)
(Continued)

(52) U.S. Cl.
CPC .......... *H01L 29/7787* (2013.01); *H01L 23/291* (2013.01); *H01L 23/3171* (2013.01); *H01L 29/2003* (2013.01); *H01L 29/205* (2013.01)

(58) Field of Classification Search
CPC . H01L 23/291; H01L 29/2003; H01L 29/513; H01L 29/518; H01L 29/7783; H01L 29/7786; H01L 29/7787; H01L 29/66462; H01L 23/3171
USPC .................. 257/194, 411, 288, 200, 192, 76; 438/778, 172, 572, 585, 786
See application file for complete search history.

(56) References Cited

U.S. PATENT DOCUMENTS 6,483,172 B1 * 11/2002 Cote ................. H01L 21/28176
257/639
8,803,158 B1 * 8/2014 Chiu .................. H01L 29/2003
257/194
(Continued)

FOREIGN PATENT DOCUMENTS

EP          1612866 A      1/2006
JP          2007-165493 A  6/2007

OTHER PUBLICATIONS

Derluyn et al., "Improvement of AlGaN/GaN high electron mobility transistor structures by in situ deposition of a Si3N4 surface layer" Journal of Applied Physics 98, 054501 (2005).
(Continued)

*Primary Examiner* — Mohammed Shamsuzzaman
(74) *Attorney, Agent, or Firm* — Knobbe Martens Olson & Bear, LLP

(57) ABSTRACT

A method for manufacturing a III-nitride HEMT having a gate electrode and source and drain ohmic contacts is provided, comprising providing a substrate; forming a stack of III-nitride layers on the substrate; forming a first passivation layer comprising silicon nitride overlying and in contact with an upper layer of the stack of III-nitride layers, wherein the first passivation layer is deposited in-situ with the stack of III-nitride layers; forming a dielectric layer overlying and in contact with the first passivation layer; forming a second passivation layer comprising silicon nitride overlying and in contact with the dielectric layer wherein the second passivation layer is deposited at a temperature higher than 450° C. by LPCVD or MOCVD or any equivalent technique; and thereafter forming the source and drain ohmic contacts and the gate electrode.

9 Claims, 9 Drawing Sheets

(51) Int. Cl.
*H01L 29/20* (2006.01)
*H01L 29/205* (2006.01)
*H01L 23/29* (2006.01)
*H01L 23/31* (2006.01)

(56) References Cited

U.S. PATENT DOCUMENTS

| | | | |
|---|---|---|---|
| 2002/0119610 A1* | 8/2002 | Nishii | H01L 29/7783 438/167 |
| 2003/0020092 A1* | 1/2003 | Parikh | H01L 29/518 257/192 |
| 2004/0138489 A1* | 7/2004 | Wang | C07F 7/025 556/400 |
| 2007/0018199 A1 | 1/2007 | Sheppard et al. | |
| 2007/0138506 A1* | 6/2007 | Braddock | H01L 21/28264 257/192 |
| 2007/0164322 A1 | 7/2007 | Smith et al. | |
| 2007/0267655 A1 | 11/2007 | Endoh et al. | |
| 2009/0146224 A1* | 6/2009 | Heying | H01L 23/3171 257/411 |
| 2010/0041243 A1* | 2/2010 | Cheng | C23C 16/345 438/778 |
| 2010/0317164 A1* | 12/2010 | Komatani | H01L 21/28264 438/172 |
| 2011/0018040 A1 | 1/2011 | Smith et al. | |
| 2013/0341678 A1* | 12/2013 | Green | H01L 21/31111 257/192 |
| 2013/0341679 A1* | 12/2013 | Green | H01L 29/402 257/192 |
| 2014/0239346 A1* | 8/2014 | Green | H01L 27/0629 257/192 |

OTHER PUBLICATIONS

Liu et al. "Temperature-dependent forward gate current transport in atomic-layer deposited Al2O3AlGaN/GaN metal-insulator-semiconductor high electron mobility transistor" Applied Physics Letters 98, 163501 (2011).

Maeda et al. "High drain current density and reduced gate leakage current in channel-doped AlGaN/GaN heterostructure field-effect transistors with Al2O3/Si3N4 gate insulator" Applied Physics Letters 87, 073504 (2005).

Maeda et al. "Systematic Study of Insulator Deposition Effect (Si3N4, SiO2, AlN, and Al2O3) on Electrical Properties in AlGaN/GaN Heterostructures" Japanese Journal of Applied Physics, vol. 46, No. 2, 2007, pp. 547-554.

Maeda et al., "Al2O3/Si3N4 Insulated Gate Channel-Doped AlGaN/GaN Heterostructure Field-Effect Transistors with Regrown Ohmic Structure: Low Gate Leakage Current with High Transconductance" Japanese Journal of Applied Physics, vol. 44, No. 4B, 2005, pp. 2747-2750.

Yue Yuan-Zheng et al. "A study on Al2O3 passivation in GaN MOS-HEMT by pulsed stress" 2008 Chinese Phys. B 17 1405.

* cited by examiner

CMOS COMPATIBLE METHOD FOR MANUFACTURING A HEMT DEVICE AND THE HEMT DEVICE THEREOF

INCORPORATION BY REFERENCE TO RELATED APPLICATIONS

Any and all priority claims identified in the Application Data Sheet, or any correction thereto, are hereby incorporated by reference under 37 CFR 1.57. This application is a divisional of U.S. application Ser. No. 13/525,644 filed Jun. 18, 2012, which claims the benefit under 35 U. S.C. §119(e) of U.S. provisional application Ser. No. 61/498,951 filed Jun. 20, 2011 and U.S. provisional application Ser. No. 61/526,107 filed Aug. 22, 2011. Each of the aforementioned applications is incorporated by reference herein in its entirety, and each is hereby expressly made a part of this specification.

FIELD OF THE DISCLOSURE

Semiconductor devices are provided. More particularly, a method for manufacturing a high electron mobility transistor (HEMT) device and the HEMT device thereof are provided.

BACKGROUND OF THE DISCLOSURE

Gallium-nitride based high electron mobility transistors (HEMTs) have attracted a lot of interest for high-frequency and lately also high-power applications because of their potentials for fast and low-loss switching, high breakdown voltage and high operating temperature.

However, AlGaN/GaN HEMTs with Schottky gates and without passivation suffer from high gate leakage, current dispersion and a variety of reliability issues.

EP 1612866 discloses that silicon nitride, especially when deposited in situ with the III-nitride layers in a metal-organic chemical-vapor deposition (MOCVD) reactor at high temperature forms a high-quality passivation layer that reduces the relaxation, cracking and surface roughness of the AlGaN. It also neutralizes the charges at the top AlGaN interface and forms a high-quality interface with low interface state density.

For power applications it is important to reduce the gate leakage current to minimize the power consumption in the off-state. To achieve fast turn-on and turn-off switching a large gate bias swing is needed. For this reason low gate leakage is essential both in reverse and forward gate biasing, the latter being in particular important for enhancement mode (e-mode) devices. To suppress the gate leakage current a gate dielectric is often inserted between the Schottky gate and the AlGaN barrier and a metal-insulator-semiconductor (MIS) transistor is fabricated.

However, an ideal gate dielectric has a high dielectric constant because devices with a higher transconductance can be achieved. Moreover, to suppress the leakage, a large band-offset energy is required at the insulator/AlGaN interface. From this viewpoint the dielectric constant for $Si_3N_4$ ($\in\sim7$) is not high enough compared to that of AlGaN compounds ($\in\sim9$). Also the bandgap of $Si_3N_4$ (~5 eV) is not much higher compared to AlGaN (~4 eV).

$Al_2O_3$ is one of the most attractive dielectrics applicable to power MIS devices because of its large bandgap (~7 eV), relatively high dielectric constant ($\in\sim9$) and high breakdown field (~10 MV/cm). Best quality $Al_2O_3$ films are deposited by atomic layer deposition (ALD) but the density of interface states (DIT) at the AlGaN interface is typically very high: $1\times10^{12}$ cm$^{-2}$ eV$^{-1}$ or higher.

Maeda et al (Appl Phys Lett 87, 073504 (2005)) discloses a MIS-HFET having a $Al_2O_3/Si_3N_4$ gate insulator, with $Si_3N_4$ in contact with AlGaN and deposited only on the gate region, i.e. under the gate metal. Between source (drain) and gate regions $Si_3N_4$ and $SiO_2$ layers were successively deposited as surface passivation. All the insulators were deposited by electron cyclotron resonance (ECR) sputtering.

Nowadays GaN transistors are typically fabricated on small area 2 inch or 3 inch diameter SiC or sapphire substrates. The Ohmic source-drain and Schottky gate electrodes are usually formed by Au-containing metallization stacks that are patterned by contact lithography followed by metal lift-off.

However, to compete with Si technology, the reduction of the cost is a key factor. For this reason, GaN epitaxial grown material on large diameter 150 mm, 200 mm or even 300 mm Si substrates is being developed. The new transistor fabrication technology should be Si-CMOS compatible using stepper lithography, Au-free metallization schemes and metal patterning by dry etching.

None of the methods referred above is suitable for use in a Si-CMOS compatible scheme.

Therefore it is desirable to have a manufacturing method for a HEMT device which is compatible with Si-CMOS process technology, enabling the use of e.g. stepper lithography, Au-free metallization schemes, and/or metal patterning by dry etching.

SUMMARY OF THE DISCLOSURE

There is provided a method for manufacturing a III-nitride HEMT having a gate electrode and source and drain ohmic contacts, comprising a) providing a substrate; b) forming a stack of III-nitride layers on the substrate; c) forming a first passivation layer comprising silicon nitride, preferably $Si_3N_4$, overlying and in contact with an upper layer of the stack of III-nitride layers, wherein preferably the first passivation layer is deposited in-situ with the stack of III-nitride layers; d) forming a dielectric layer overlying and in contact with the first passivation layer; e) forming a second passivation layer comprising silicon nitride, preferably $Si_3N_4$, overlying and in contact with the dielectric layer wherein the second passivation layer is deposited at a temperature higher than 450° C. by LPCVD or MOCVD or any equivalent technique; and thereafter f) forming the source and drain ohmic contacts, and the gate electrode in such a way that a gate dielectric is formed comprising the first passivation layer and at least part of the dielectric layer. The second passivation layer may be deposited at a temperature higher than 450° C. by a deposition technique such as a chemical vapor deposition technique, e.g. Low Pressure Chemical Vapor Deposition and/or Metal Organic Chemical Vapor Deposition.

In an embodiment, the steps c), d) and e) are performed in-situ by MOCVD.

In an embodiment, forming the source and drain ohmic contacts further comprises:—patterning source and drain ohmic contact regions by selectively etching the second passivation layer, the dielectric layer and the first passivation layer; and—forming ohmic contacts by deposition of a metal layer, patterning the metal layer and ohmic alloy formation. Preferably, the metal layer patterning comprises a dry-etch process of the metal layer wherein the dry-etch process of the metal layer consumes partially the second passivation layer.

In an embodiment, forming the gate electrode further comprises:—patterning a gate trench by selective etching of the second passivation layer towards the dielectric layer; and—forming the gate electrode in the gate trench by deposition of a metal gate layer and patterning the metal gate layer. Preferably, the metal layer patterning comprises a dry-etch process of the metal layer wherein the dry-etch process of the metal layer consumes partially the second passivation layer.

In an embodiment, the method further comprises:—forming a dielectric cap layer on either the source and drain ohmic contacts or the gate electrode, preferably depending on which is formed first passivation, thereby protecting the source and drain ohmic contacts or the gate electrode during the subsequent metal layer or metal gate layer deposition.

In an embodiment, forming the gate trench further comprises etching at least partially the dielectric layer followed by re-deposition of a second dielectric layer prior to forming the gate electrode.

In an embodiment, the dielectric layer comprises Al.

In an embodiment, the dielectric layer is selected from the group consisting of $Al_2O_3$, AlN, AlSiN and any mixtures or combinations thereof.

In an embodiment, the dielectric layer comprises $Al_2O_3$.

In an embodiment, the dielectric layer comprises AlN.

In an embodiment, the first passivation layer has a thickness of at least 0.5 nm.

In an embodiment, the second passivation layer has a thickness of at least 50 nm.

There is also provided an engineered substrate for III-nitride HEMT device fabrication comprising: a) a substrate; b) a stack of III-nitride layers on the substrate; c) a first passivation layer comprising silicon nitride, preferably $Si_3N_4$, overlying and in contact with an upper layer of the stack of III-nitride layers; d) an dielectric layer overlying and in contact with the first passivation layer, the dielectric layer comprising a high-k dielectric material; and e) a second passivation layer comprising silicon nitride, preferably $Si_3N_4$, preferably LPCVD silicon nitride, more preferably LPCVD $Si_3N_4$, overlying and in contact with the dielectric layer. Hence, preferably, the silicon nitride is deposited at a temperature higher than 450° C. by a deposition technique such as a Chemical Vapor Deposition technique, e.g. Low Pressure Chemical Vapor Deposition and/or Metal Organic Chemical Vapor Deposition.

There is also provided a II-nitride HEMT device obtainable with a method according to the disclosure, formed on an active area of a substrate, comprising a gate electrode and source and drain contacts, and further comprising: a) a substrate; b) a stack of III-nitride layers on the substrate; c) a first passivation layer comprising silicon nitride, preferably $Si_3N_4$, overlying and in contact with an upper layer of the stack of III-nitride layers everywhere on the active area except under the source and drain contacts; d) an dielectric layer overlying and in contact with the first passivation layer everywhere on the active area except under the source and drain contacts, the dielectric film comprising a high-k dielectric material; and e) a second passivation layer comprising silicon nitride, preferably $Si_3N_4$, preferably LPCVD silicon nitride, more preferably LPCVD $Si_3N_4$, overlying and in contact with the dielectric layer everywhere on the active area except under the gate electrode and under the source and drain contacts. Hence, preferably, the silicon nitride is deposited at a temperature higher than 450° C. by a deposition technique such as a Chemical Vapor Deposition technique, e.g. Low Pressure Chemical Vapor Deposition and/or Metal Organic Chemical Vapor Deposition.

In an embodiment, the silicon nitride, preferably the LPCVD silicon nitride, of the second passivation layer contains 3-8% H and/or has a density of about 2.9-3.1 $g/cm^3$.

In an embodiment, the dielectric layer comprises multiple layers.

In an embodiment, the dielectric layer comprises Al.

In an embodiment, the dielectric layer is selected from the group consisting of $Al_2O_3$, AlN, AlSiN and any mixtures or combinations thereof In an embodiment, the dielectric layer comprises $Al_2O_3$.

In an embodiment, the dielectric layer comprises AlN.

In an embodiment, the first passivation layer has a thickness of at least 0.5 nm.

In an embodiment, the second passivation layer has a thickness of at least 50 nm.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF ILLUSTRATIVE EMBODIMENTS

Figure 1:
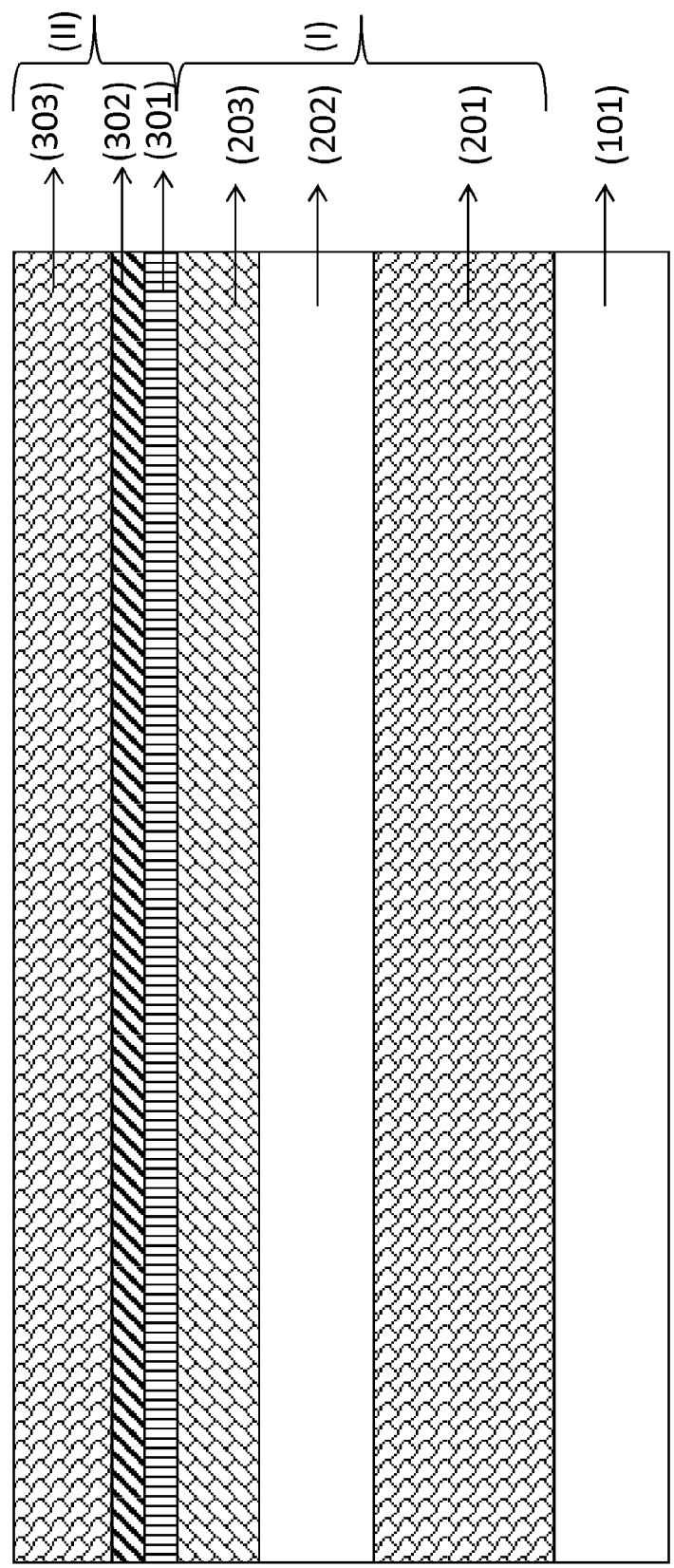
FIG. 1 illustrates schematically the engineered substrate of the disclosure: substrate 101; stack of III-nitride layers I: buffer layer 201, channel layer 202, barrier layer 203; passivation stack II: first passivation layer 301, dielectric layer 302, second passivation layer 303.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

An aim of the present disclosure is to provide a method for manufacturing a III-nitride HEMT compatible with a Si-CMOS manufacturing flow. Another aim is to provide a method for manufacturing a III-nitride HEMT compatible with Au-free process flow using dry-etch techniques for metal patterning.

Another aim is to provide an engineered substrate for III-nitride HEMT fabrication suitable to be used in a Si-CMOS compatible manufacturing flow. Yet another aim is to provide a III-nitride HEMT device having improved performance.

Group III-nitride devices, such as e.g. high electron mobility transistors (HEMTs), comprise a two-dimensional electron gas (2-DEG) between two active layers, e.g. between a GaN layer and an AlGaN layer. This 2-DEG layer is a result of the difference of piezoelectric and spontaneous polarization leading to charge separation within the materials. In known devices of this type, the 2-DEG is present at zero gate bias due to the characteristics of the materials. GaN field effect transistor devices (FETs) with contacts formed on top of an AlGaN layer are normally-on devices. The formation of contacts on the AlGaN layer does not change the charge polarization in the heterostructure such that, if there was a 2-DEG present before processing, it would remain there after formation of contacts on top of the AlGaN layer. A certain negative voltage, called threshold voltage, on the gate is required to deplete the 2-DEG through capacitive coupling. By applying a negative voltage to the gate, the electron channel can be pinched off. This negative voltage is typically below a negative threshold voltage (Vth), typically between −1V and −8V. These transistors work in depletion-mode (D-mode) which means that the channel has to be depleted to switch off the transistor.

For certain applications, such as e.g. power switching or integrated logic, a negative-polarity gate voltage supply is not wanted; the gate control of power devices in e.g. power supplies should be made similar to that used for Si devices. Field-effect transistors (FET) with a threshold voltage Vth>0V are normally-off devices. At zero gate voltage, no channel is present to conduct current. These transistors work in enhancement-mode (E-mode). E-mode transistors are attractive for normally-off power switches, for digital electronics applications, and for high efficiency RF applications.

In both the D-mode and the E-Mode configurations, a metal insulator semiconductor high electron mobility transistor (MISHEMT) is preferred because of the possibility to overdrive the gate in the forward direction which enables to benefit from the full sheet carrier density. Another advantage of the MISHEMT, is the suppression of the gate and drain leakage currents resulting e.g. in lower power consumption of the power switches in the off-state. In the case of MISHEMTs, gate dielectrics have been used comprising $SiO_2$, $Si_3N_4$ and other oxides with high dielectric constant such as $Al_2O_3$, $HfO_2$ or $Sc_2O_3$ (high-k dielectrics). However, in all cases, the interface between the semiconductor and the deposited oxide is difficult to control which prevent to benefit from the full potentiality of the MISHEMT configuration and poor device reliability.

In the present disclosure, the term 'III-nitride' denotes a semiconductor material that comprises at least one element from Group III of the Periodic Table of Elements and nitrogen. Examples of III-nitride compound semiconductors that can be used in the present disclosure include, but are not limited to GaN, AlN, InGaN, InAlN, AlGaN, mixtures and combinations thereof.

Throughout this disclosure, the term 'band gap' refers to the energy difference between the top of the valence band and the bottom of the conduction band. In general, a wide band gap (WBG) semiconductor is a semiconductor material with an electronic band gap larger than 1 eV and, preferably, larger than 2 eV. In general, a narrow band gap (NBG) semiconductor is a semiconductor material with an electronic band gap smaller than 1 eV and, preferably, smaller than 0.6 eV. However, the absolute ranges described above are only informative, since throughout this disclosure, it is rather the relative difference between the WBG and NBG that will determine the good working of the device, than the actual absolute value of the band gap.

The dielectric material having a dielectric constant of greater than 3.9 (k value of $SiO_2$) is referred to herein as a high-k dielectric. Typically, a high-k dielectric has a dielectric constant of about 7.0 or larger, with a dielectric constant of about 10.0 or larger being even more typical.

In a first aspect present application discloses a method for manufacturing a III-nitride HEMT having a gate electrode and source and drain ohmic contacts comprising:

a) providing a substrate 101, b) forming by epitaxial growth a stack of layers (I) on the substrate, each layer comprising a III-nitride material and c) forming a first passivation layer 301 comprising silicon nitride overlying and in contact with an upper layer 203, 204 of the stack of (III-nitride) layers (I), wherein the first passivation layer 301 is deposited in-situ with the stack of layers (I) and d) forming a dielectric layer 302 overlying and in contact with the first passivation 301 layer and, e) forming a second passivation layer 303 comprising silicon nitride overlying and in contact with the dielectric layer 302 wherein the second passivation layer 303 is deposited at a temperature higher than 450° C. by Low Pressure Chemical Vapor Deposition (LPCVD) or Metal Organic Chemical Vapor Deposition (MOCVD) or an equivalent technique and thereafter f) forming the source and a drain ohmic contacts and the gate electrode 601.

Figure 2:
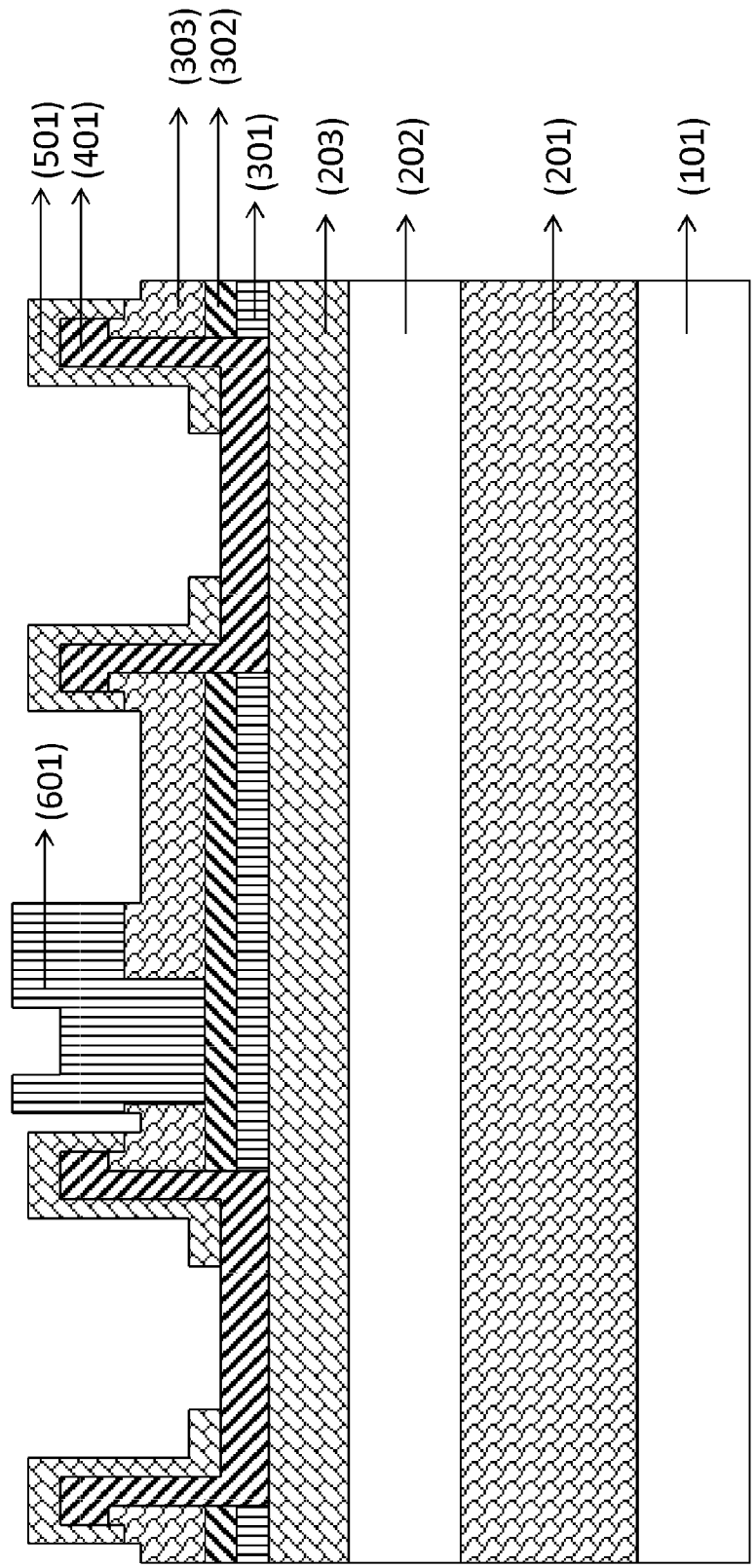
FIG. 2 illustrates schematically the III-nitride device of the disclosure: substrate 101; buffer layer 201, channel layer 202, barrier layer 203; first passivation layer 301, dielectric layer 302, second passivation layer 303; metal layer for ohmic contacts 401; dielectric cap layer 501; metal gate layer/stack of layers 601.

The numbers between brackets make reference to FIGS. 1 and 2 which illustrate schematically the engineered substrate and the III-nitride device of the disclosure, respectively.

In embodiments of the different aspects of the disclosure the term "substrate" may include any underlying material or materials that may be used, or upon which a device, a circuit or an epitaxial layer may be formed. In other alternative embodiments, this "substrate" may include a semiconductor substrate such as, e.g., a doped silicon, a gallium arsenide (GaAs), a gallium arsenide phosphide (GaAsP), an indium phosphide (InP), a germanium (Ge), or a silicon germanium (SiGe) substrate. The "substrate" may include for example, a dielectric layer such as a $SiO_2$ or an $Si_3N_4$ layer in addition to a semiconductor substrate portion. Thus, the term substrate also includes silicon-on-glass, silicon-on sapphire substrates. Also, the "substrate" may be any other base on which a layer is formed, for example a glass or metal layer.

Preferably, the substrate comprises silicon, silicon carbide, sapphire or III-nitride materials such as GaN. More preferably the substrate is made of silicon. More preferably the substrate is made of mono-crystalline silicon having a (111) or an equivalent crystalline orientation. In specific embodiments of the disclosure the substrate is a silicon wafer having (111) crystalline orientation and a diameter of 150 mm, 200 mm or 300 mm. Advantageously, using a silicon wafer enables co-integration with silicon based CMOS.

A stack of layers, each layer comprising a III-nitride material, hereinafter referred to as "a stack of III-nitride layers" is preferably formed by epitaxial techniques on the substrate. The stack of III-nitride layers comprises in general a buffer layer 201, a channel layer 202 and a barrier layer 203, which are also referred to as the active layers of the HEMT device. Alternatively, the channel layer can be the upper part (top) of a thick buffer layer 201. Each of the active layers can be a multi-layer or a layer having a graded composition.

The active layers of the HEMT can for example be fabricated by metal-organic chemical vapor deposition (MOCVD) or by molecular beam epitaxy (MBE), in which the device layers are built up by deposition of molecules in a vacuum.

A conventional HEMT, e.g. an AlGaAs/GaAs HEMT, uses an undoped relatively low-bandgap material for the channel layer (for example GaAs), which is supplied with electrons by a doping layer located between the channel and the gate contact in a barrier layer made of a relatively higher bandgap material (for example AlGaAs). By combining materials with different bandgaps, i.e. a material with a higher bandgap and a material with a lower bandgap, a quantum well may be formed at the interface between the combined materials. The separation of the channel dopant layer, where electron scattering is high, from the channel itself significantly increases the mobility of the electrons in the channel. It is the high mobility of the carriers that provides the fundamental advantage of HEMT technology over conventional MESFET devices in high frequency operation. In the more particular case of an AlGaN/GaN HEMT, the higher bandgap material, in the example given AlGaN, is undoped and a high sheet carrier concentration in the quantum channel is obtained by piezoelectric and spontaneous polarization induced effects.

The HEMT growth typically starts with a buffer layer 201 to achieve a high quality device. In case the substrate material is different from the active material, this buffer layer also accommodates the difference in lattice constant.

In the context of the present disclosure the thickness of the buffer layer 201 may, for example, be between 200 nm and 10 μm, preferably between 1 μm and 3 μm. Optionally, additional buffer layers 201', e.g. nucleation layers and/or inter-layers such as e.g. AlGaN, AlN or GaN interlayers, may be provided to overcome the thermal expansion and lattice mismatch between the substrate and the active layers.

Next, the channel layer 202 may comprise GaN, GaAs or InGaAs. The thickness of the channel layer may, for example, be between 5 nm and 200 nm, preferably between 50 nm and 200 nm. Next, the barrier layer 203 may, for example, comprise AlGaN, AlGaAs or InAlAs. The thickness of the barrier layer may, for example, be between 1 and 50 nm, preferably between 5 nm and 30 nm. Alternatively, AlGaAs/GaAs transistor can be fabricated, without an explicit channel layer. Additionally, a cap layer (204, not shown) comprising a III-nitride material can be formed by epitaxial growth on the barrier layer 203. Such additional cap layer may comprise GaN and have a thickness between 1 nm and 10 nm.

In a next step, a first passivation layer 301 comprising silicon nitride is grown, preferably in-situ, such that it is overlying and in contact with an upper layer of the stack of layers. The upper layer can be the barrier layer 203 or the additional cap layer 204 or any other III-nitride layer part of the stack of III-nitride layers (I) used to form the HEMT. The first passivation layer 301 is preferably deposited in-situ with the stack of layers, i.e. in the same process chamber by MOCVD or MBE or an equivalent technique. In a specific embodiment the first passivation layer 301 is deposited in-situ with the stack of layers by MOCVD at a temperature between 900° C. and 1250° C., more preferably at 1100° C.

In embodiments of the different aspects of the disclosure, the first passivation layer comprises silicon nitride ($Si_3N_4$). In some embodiments the first passivation layer may further comprise Al. Optionally, the first passivation layer can be made of a single layer with homogeneous composition, a single layer having a gradual composition or it can comprise a plurality of layers. More preferably, the first passivation layer consists of silicon nitride ($Si_3N_4$). Preferably, the thickness of the first passivation layer (in-situ silicon nitride) is between 0.5 nm and 20 nm, more preferably between 0.5 and 10 nm.

Next, a dielectric layer 302 overlying and in contact with the first passivation layer is deposited by Atomic Layer Deposition (ALD) or MOCVD. Alternatively a metallization (e.g. Al metallization) can be performed first followed by high-temperature oxidation to form the dielectric layer. Preferably, the dielectric layer is deposited by ALD.

Optionally, in embodiments of the different aspects of the disclosure, the first passivation layer 301, the dielectric layer 302 and the second passivation layer 303 are all grown in-situ by MOCVD, sequentially (without "vacuum break"), on top of the III-nitride layers.

Optionally, the first passivation layer 301 and the second passivation layer (303) comprises each $Si_3N_4$, preferably both passivation layers are made of $Si_3N_4$. The dielectric layer 302 preferably comprises Al. Preferably the dielectric layer 302 is selected from the group consisting of AlN, AlSiN, $Al_2O_3$ and any combinations or mixtures thereof. More preferably, the dielectric layer 302 comprises AlN, which is particularly advantageous when performing the steps c), d) and e) of the method above in-situ by MOCVD. Alternatively, or preferably, the dielectric layer 302 comprises $Al_2O_3$.

Alternatively, the dielectric layer 302 may comprise a high-k dielectric material such as $Al_2O_3$, $HfO_2$, $ZrO_2$ or combinations and/or mixtures thereof.

In embodiments of the different aspects of the disclosure, the dielectric layer 302 can be a single layer having a homogeneous composition. Alternatively the insulation layer can be a single layer with graded composition or it can comprise a plurality of layers.

The dielectric layer 302 and the first passivation layer 301 function both as gate dielectric. Therefore in the context of the present disclosure the gate dielectric is also referred to as a bi-layer gate dielectric. Additionally in the method of the disclosure, the dielectric layer 302 functions as a etch stop layer for etching selectively the second passivation layer 303 made of LPCVD (or equivalent) silicon nitride. Moreover in the particular embodiment wherein the dielectric layer 302 consists of $Al_2O_3$, it can be removed selectively by wet etch with respect to the first passivation layer (301, in-situ silicon nitride).

Preferably the dielectric layer has a thickness between 1 nm and 30 nm, more preferably between 1 nm and 20 nm. The thickness of the dielectric layer is determined by the gate dielectric specifications of the HEMT device since 1 nm is in principle enough to function as a etch stop layer.

In particular embodiments the dielectric layer consists of $Al_2O_3$ deposited by ALD at a temperature of about 400° C. Optionally, a post deposition anneal at a temperature below the crystallization temperature of the high-k material can be applied.

In general the density of the interface states (DIT) can be lowered by applying a high temperature (600° C.-800° C.) post-dielectric deposition (PDA) or post-metal-deposition annealing (PMA).

In the particular case of a dielectric layer consisting of $Al_2O_3$, a post-deposition anneal at a temperature between 600° C. and 1000° C. is applied. The crystallization temperature of ALD $Al_2O_3$ is between 800° C. and 850° C. The PDA or PMA annealing temperature will be higher than this temperature when a polycrystalline film is preferred.

Next, a second passivation layer 303 comprising silicon nitride ($Si_3N_4$) overlying and in contact with the dielectric layer 302 is formed. The second passivation layer 303 is deposited by LPCVD (batch or single wafer process) or MOCVD or any equivalent technique at a temperature higher than 450° C., more preferably higher than 550° C., even more preferably higher than 700° C.

In embodiments of the disclosure, the second passivation layer is deposited at a temperature above the Ohmic contact alloy temperature. The Ohmic contact alloy temperature is between 500° C.-700° C. for Au-free Ohmic contacts and between 700° C.-900° C. for Au-containing metallization schemes.

Preferably the second passivation layer consists of silicon nitride ($Si_3N_4$). Throughout this disclosure the silicon nitride deposited at a temperature higher than 450° C., by LPCVD (batch or single wafer process, i.e. SINgen™) or MOCVD or any equivalent technique will be referred to as "LPCVD silicon nitride". Preferably the LPCVD silicon nitride is deposited at a temperature between 550° C. and 800° C., more preferably between 600° C. and 800° C.

In the embodiments covering integration schemes wherein the metal gate 601 material is dry-etched stopping in the second passivation layer 303, the thickness of the second passivation layer 303 should be thick enough to withstand the metal gate over-etch. Preferably the second passivation layer (LPCVD silicon nitride) has a thickness of at least 50 nm, more preferably about 120 nm.

Advantageously, the LPCVD silicon nitride layer deposited at high temperature is a better passivation layer than a PECVD (plasma enhanced chemical vapor deposition) silicon nitride. LPCVD nitride has lower H-content, about 3-8% versus 10-40% for PECVD nitride. Also LPCVD nitride has a higher density: about 2.9-3.1 g/cm³ versus 2.3-3.1 g/cm³ for PECVD nitride, and lower pinhole density. Similar values with LPCVD silicon nitride are valid for the H-content and the density of the MOCVD silicon nitride.

It is known that a PECVD silicon nitride layer is deposited at a temperature of about 300° C.-400° C. When subjected to a higher temperature e.g. the temperature of ohmic alloy formation in a subsequent step such a layer shows blisters and cracks or delamination compromising the device yield. The LPCVD silicon nitride does not have these drawbacks.

In the method of the disclosure the second passivation layer made of LPCVD silicon nitride protects the underlying layers and prevents the 2DEG damage during the dry-etch processes, e.g. metal etch for ohmic contacts formation and/or metal gate etch for gate electrode formation. The rather thick layer of LPCVD silicon nitride is deposited in a cost efficient, Si-CMOS compatible process.

In a next step, source and drain ohmic contacts are formed on the HEMT structure by a sequence comprising the following:

a) patterning source and drain ohmic contact regions by selectively etching the second passivation layer 303, the dielectric film 302 and the first passivation layer 301, b) forming ohmic contacts by deposition of a metal layer 401, patterning the metal layer and thermal treatment for ohmic alloy formation.

In specific embodiments selectively etching the second passivation layer (303, LPCVD silicon nitride) towards the dielectric layer 302 comprising $Al_2O_3$ is performed by dry-etch with $SF_6$-comprising plasma. Next, the $Al_2O_3$ film is removed with high selectivity towards the first passivation layer (301, in-situ $Si_3N_4$) by wet etch with diluted HF solutions. Next, the in-situ silicon nitride 301 is removed by dry-etch with $SF_6$-comprising plasma with high selectivity towards to AlGaN barrier layer 203.

The metal layer 401 can be a metal stack comprising multiple metal layers, preferably an Au-free metal stack which is compatible with Si processing. Examples of suitable metal layer stacks that can be used to form source and drain contacts are Ti/Al, Ti/Ta/Al, Ti/Al/TiW, Ti/Al/TiN, Ti/Al/W and Ti/Al/WSi. Other examples may be Ta/Al/M, TaN/Al/M, Ta/Si/M, TaN/Si/M whereby M can be another metal stack. The function of the metal stack M can be to prevent oxidation of the underlying materials and/or to lower the contact resistance of source and drain contacts. M can, for example, be TaN/Cu.

The patterning of the metal layer 401 for forming ohmic contacts can be performed either by lift-off techniques, or by direct etch (e.g. dry-etch).

Preferably the thermal treatment for ohmic alloy formation is performed at a temperature between 500° C. to 900° C. More preferably the ohmic alloy formation is performed at a temperature below the LPCVD nitride deposition temperature which is between 600° C. and 800° C. Au-free Ohmic contacts to AlGaN/GaN have typical Ohmic alloy temperatures around 600° C., while this is around 800° C. for Au-containing Ohmic contacts. More preferably the ohmic alloy formation is performed at a temperature below the crystallization temperature of the high-k material used as gate dielectric, i.e. between 500° C. to 850° C. in the particular embodiment wherein $Al_2O_3$ is used as dielectric layer.

It is an advantage of the method of the disclosure that after the ohmic alloy formation the manufacturing process has a low thermal budget, i.e. does not comprise a process step at a temperature above the temperature of the ohmic alloy formation.

Next, forming the gate electrode 601 is performed, which further comprises:

a) patterning a gate trench by selective etching of the second passivation layer 303 with respect to the dielectric layer 302, b) forming the gate electrode 601 at least in the gate trench by deposition of a metal gate layer and patterning the metal gate layer.

Alternatively, forming the gate electrode can be performed first, followed by forming the ohmic contacts.

The metal gate layer can be a layer with a homogeneous composition or a layer with a graded composition. Alternatively, the metal gate layer can be a multi-layer (or stack of metal layers) having a work-function suitable to form the gate electrode.

Examples of suitable metal gate stacks that can be used to form the gate electrode are Ni, Mo, TiN, TaN, W, WSiN or WN eventually combined with an Al, Ti/Al, TiN/Al or Ti/TiN/Al overlayer to lower the gate metal resistance.

Patterning the metal gate layer can be performed either by lift-off techniques or by direct etch (e.g. dry-etch) of the metal gate layer stopping on the second passivation layer. In the embodiments wherein dry-etch is employed, the second passivation layer 303 can be partially consumed (removed) during the over-etch step of the dry-etch process as shown in FIG. 2: the second passivation layer is thinner in the exposed regions (between gate edge and source/drain contacts) when compared to the original (as-deposited) thickness in the regions covered by e.g. the metal gate electrode 601.

The method of the disclosure can further comprise: forming a dielectric cap layer 501 on either the source and drain ohmic contacts or the gate electrode depending on which is formed first, thereby protecting the source and drain ohmic contacts or the gate electrode during the subsequent metal layer 401 or, respectively, during the metal gate layer 601 deposition.

In alternative embodiments of the disclosure, forming the gate trench further comprises etching at least partially the dielectric layer 302 followed by re-deposition of a second dielectric layer (302', not shown) prior to forming the gate electrode.

In embodiments of the disclosure the dielectric layer 302 can be etched partially or fully stopping on the underlying first passivation layer 301. A second dielectric layer 302' can be thereafter deposited on the remaining dielectric layer (resulted upon partially etching of the dielectric layer) or on the first passivation layer 301 when the dielectric layer 302 has been removed completely. The second dielectric layer 302' can be a layer with a homogeneous composition, or a layer with a graded composition, or a stack of multiple layers (multi-layer). The second insulation layer can be deposited by ALD, MBE or by sputtering, optionally followed by a post deposition anneal. In the embodiments wherein the ohmic contacts are formed first, the temperature of the post deposition anneal of the second dielectric layer should be kept below the ohmic alloy formation temperature. Also, the temperature of the post deposition anneal of the second dielectric layer is lower or equal to the ohmic contact alloy temperature.

In a second aspect the present application discloses an engineered substrate for III-nitride HEMT fabrication comprising:

a) a substrate 101 b) a stack of layers (I) on the substrate, each layer comprising a III-nitride material (referred also as "a stack of III-nitride layers")

c) a first passivation layer 301 comprising silicon nitride overlying and in contact with an upper layer of the stack of III-nitride layers d) a dielectric layer 302 overlying and in contact with the first passivation layer 301, the dielectric layer comprising a high-k dielectric material e) a second passivation layer 303 comprising silicon nitride overlying and in contact with the dielectric film.

In specific embodiments of the disclosure the substrate is a silicon wafer made of mono-crystalline silicon with a (111) orientation or equivalent.

Both the first passivation layer 301 and the second passivation layer 303 of the engineered substrate and of the HEMT device of the disclosure comprise silicon nitride deposited according to the method of the disclosure (referred to as LPCVD silicon nitride), i.e. silicon nitride having low H-content (about 3-8%) and high density (about 2.9-3.1 g/cm3).

The engineered substrate of the disclosure is obtainable by the method of the disclosure and has the advantage of providing a passivated substrate comprising a gate dielectric which is suitable to be used for forming a HEMT device in a Si-CMOS compatible manufacturing process.

Another advantage of the engineered substrate as starting substrate to manufacture a III-nitride HEMT is that the high temperature budget processes, such as the post deposition anneal of the gate dielectric or the high temperature deposition of the passivation layer, are performed before (prior to) the ohmic contacts formation, eliminating in this way the constraints imposed by the ohmic alloy formation to all the subsequent process steps in state of the art integration schemes and thereby improving the overall performance of the HEMT device.

Yet another advantage of the engineered substrate as starting substrate to manufacture a III-nitride HEMT is that the three-layer stack (II) formed by the in-situ silicon nitride 301, the dielectric layer 302 and LPCVD silicon nitride 303 is suitable to passivate the III-nitride stack (I) and to protect the III-nitride stack (I) during both ohmic contacts formation and gate electrode formation when using Au-free metallization steps and dry-etch of the metal (or metal gate) layers to manufacture III-nitride HEMT devices.

Yet another advantage of the engineered substrate as starting substrate to manufacture a III-nitride HEMT is that the LPCVD nitride can withstand the temperature budget of the ohmic contacts formation, which is not the case for PECVD nitride as stated already elsewhere in the description.

In a third aspect present application discloses a III-nitride HEMT obtainable with the method of the disclosure, formed on an active area of a substrate, the III-nitride HEMT comprising a gate electrode and source and drain contacts, and further comprising:

a) a substrate 101 b) a stack of layers (I) on the substrate, each layer comprising a III-nitride material (referred to also as a stack of III-nitride layers)

c) a first passivation layer 301 comprising silicon nitride overlying and in contact with an upper layer 203, 204 of the stack everywhere on the active area except under the source and drain contacts d) a dielectric layer 302, 302' overlying and in contact with the first passivation layer 301 everywhere on the active area except under the source and drain contacts, the dielectric film comprising a high-k dielectric material e) a second passivation layer 303 comprising (LPCVD) silicon nitride overlying and in contact with the dielectric layer everywhere on the active area except under the gate electrode and under the source and drain contacts.

According to a generally applicable aspect of the disclosure, there may be provided, or there may be obtained as a result of carrying out a method according to the disclosure, a first passivation layer comprising silicon nitride, preferably $Si_3N_4$, that overlies and is in contact with an upper layer of the stack of III-nitride layers, and an dielectric layer that overlies and is in contact with the first passivation layer. Hence, there may be provided, or there may be obtained as a result of carrying out a method according to the disclosure, a bilayer gate dielectric, which comprises, or consists of, the first passivation layer and the dielectric layer. Preferably, the dielectric layer is deposited on top of the first passivation layer for obtaining the bilayer gate dielectric. By means of a first passivation layer comprising silicon nitride, especially when deposited in situ with the III-nitride layers in a metal-organic chemical-vapor deposition (MOCVD) reactor at high temperature, a high-quality passivation layer may be obtained that reduces the relaxation, cracking and surface roughness of the AlGaN. It may also neutralize the charges at the top AlGaN interface and/or may form a high-quality interface with low interface state density. After deposition, a thickness of the first passivation layer may optionally be reduced. For such reducing, techniques that are known as such to the skilled person may be used. After deposition, a thickness of the first passivation layer may, e.g., be approximately 100 nanometer. After reducing of the thickness, the thickness of the first passivation layer may e.g. be at most 20 nanometer, at most 10 nanometer, or at most 5 nanometer, e.g. approximately 3 nanometer. The dielectric layer may be chosen different from $Si_3N_4$ or free from silicon nitride. The dielectric layer may be chosen so that is has, e.g. in comparison with $Si_3N_4$, relatively high, e.g. higher than approximately 9, dielectric constant and/or a relatively high, e.g. higher than 10 MV/cm, breakdown field. The dielectric layer may e.g. be deposited by atomic layer deposition.

To illustrate some advantages, or the advantages, of the method of the disclosure and the device thereof we fabricated and evaluated two types of AlGaN/GaN HEMTs using an $Al_2O_3$ gate dielectric. Preferably, both HEMTs were processed using Au-containing processes and lift-off "HEMT A" uses the conventional method with a single ALD $Al_2O_3$ gate dielectric deposited after the gate recess of thick in-situ nitride. "HEMT B" is processed using the method of the disclosure with thin in-situ nitride, followed by ALD $Al_2O_3$ and LPCVD nitride deposition as first steps.

The fabrication of "HEMT A" comprises the following process steps, in sequence:

a) forming the AlGaN/GaN epilayer stack, grown on top of a Si(111) substrate, consisting of an AlN nucleation layer, followed by a 2.5 μm thick AlGaN buffer layer, a 150 nm thick GaN channel layer, a 10 nm 35% AlGaN barrier layer;

b) forming 120 nm in-situ silicon nitride passivation;

c) forming the Ohmic contacts by defining the Ohmic areas with contact lithography, dry etching of the 120 nm in-situ nitride using a $SF_6$ plasma, deposition of a Ti/Al/Mo/Au metal stack, lift-off and alloy, preferably alloy formation;

d) device isolation;

e) gate trench etching using contact lithography followed by dry etching of the 120 nm in-situ nitride using a $SF_6$ plasma;

f) wafer cleaning in a HCl/TMAH solution, immediately followed by the deposition of the 10 nm $Al_2O_3$ film and a 700° C. post-deposition annealing step;

g) gate metal deposition using contact lithography, deposition of a Mo/Au metal stack and lift-off.

The fabrication of "HEMT B" comprises the following process steps, in sequence:

a) forming the AlGaN/GaN epilayer, grown on top of a Si(111) substrate, consisting of an AlN nucleation layer, followed by a 2.5 μm thick AlGaN buffer layer, a 150 nm thick GaN channel layer, a 10 nm 25% AlGaN barrier layer;

b) forming 5 nm in-situ silicon nitride passivation;

c) wafer cleaning in a HCl/TMAH solution, immediately followed by the deposition of the 10 nm $Al_2O_3$ film and a 700° C. post-deposition annealing step;

d) deposition of 120 nm LPCVD nitride at 800° C.;

e) ohmic contact formation by defining the Ohmic areas with contact lithography, dry etching of the 120 nm LPCVD nitride using a $SF_6$ plasma, wet etching of the $Al_2O_3$ ALD film in diluted BHF (buffered HF) and dry etching of the 5 nm in-situ nitride using a $SF_6$ plasma; followed by the deposition of the Ti/Al/Mo/Au metal stack, lift-off and alloy;

f) device isolation.

g) gate trench etching using contact lithography followed by dry etching of the 120 nm LPCVD nitride using a $SF_6$ plasma. The 10 nm ALD $Al_2O_3$ and the 5 nm in-situ nitride layer were not removed, resulting in a bilayer gate dielectric consisting of 5 nm in-situ nitride at the bottom and 10 nm $Al_2O_3$ on top.

h) gate metal deposition using contact lithography, deposition of a Mo/Au metal stack and lift-off.

The tests were performed with Au-comprising metallization and lift off to prove the feasibility of the concept and the improved performance of the device of the disclosure. However for Si-CMOS compatibility Au-free metallization is desirable.

Figure 3:
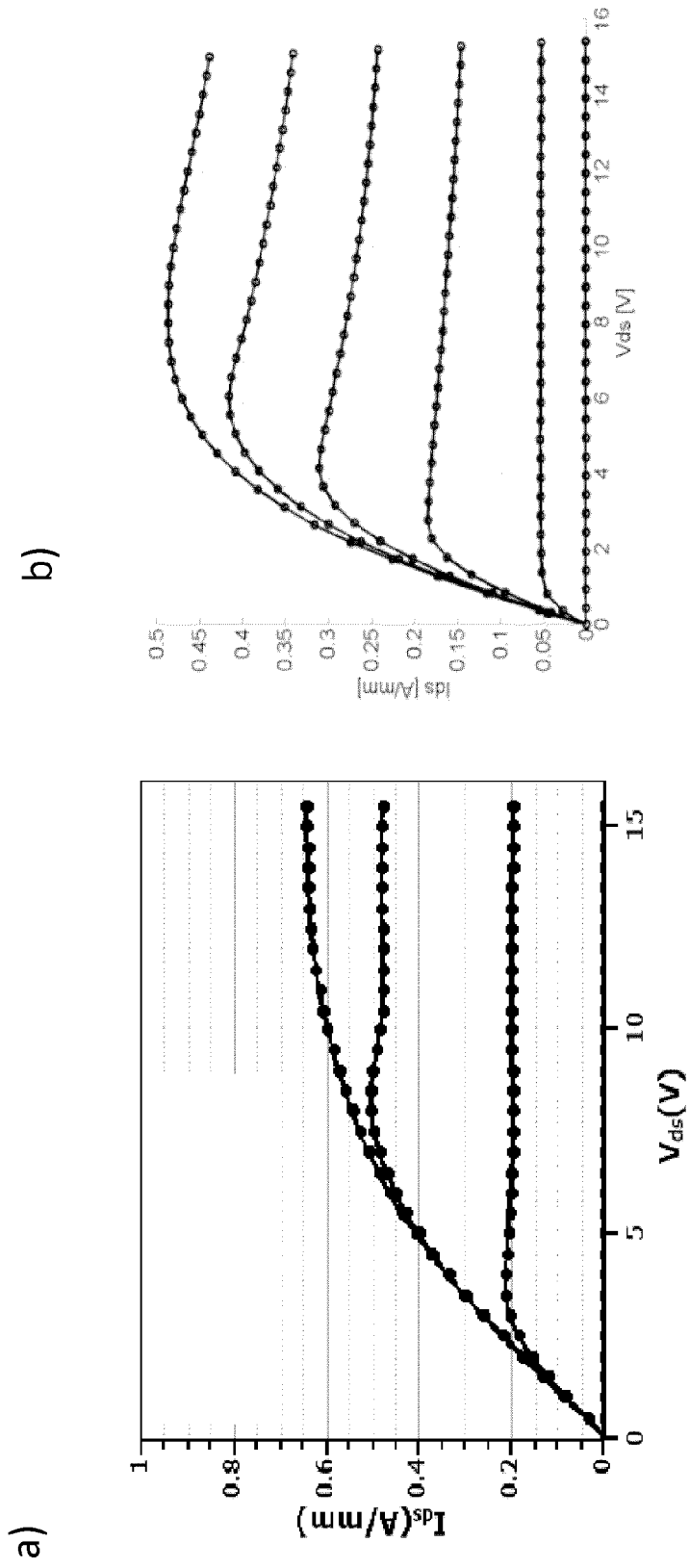
FIG. 3 shows the Id-Vds transistor characteristics for: a) "HEMT A", b) "HEMT B".

The Id-Vds transistor characteristics for "HEMT A" are shown in FIG. 3a in comparison to the characteristics for "HEMT B" in FIG. 3b. The Vgs bias is from −10V to 5V (step 5V) for "HEMT A" and from −6V to 2V for "HEMT B" (step 1V). The more negative Vth for "HEMT A" is explained by the higher Al concentration of the AlGaN barrier. Both devices "HEMT A" and "HEMT B" show good DC transistor behavior with good pinch-off and low leakage.

Figure 4:
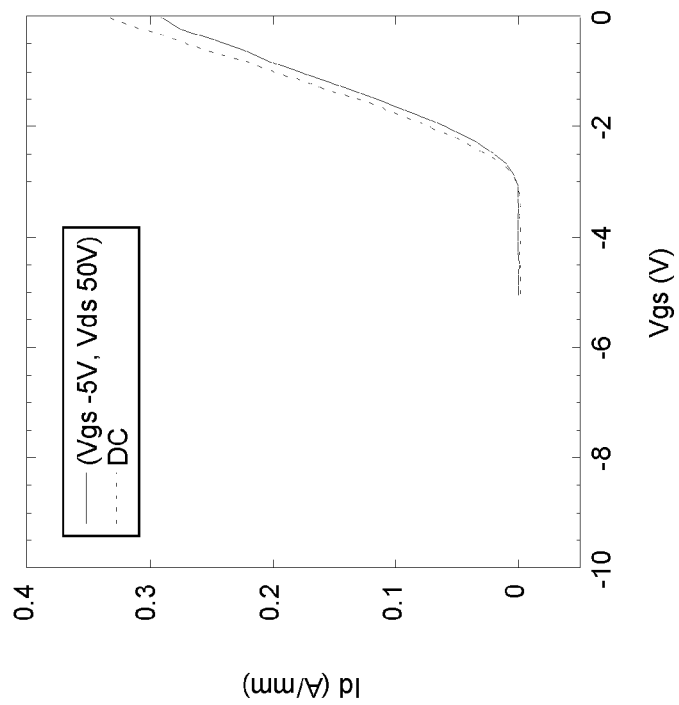
FIG. 4 shows the pulsed Id-Vgs characteristics for: a) "HEMT A", b) "HEMT B".
Figure 4:
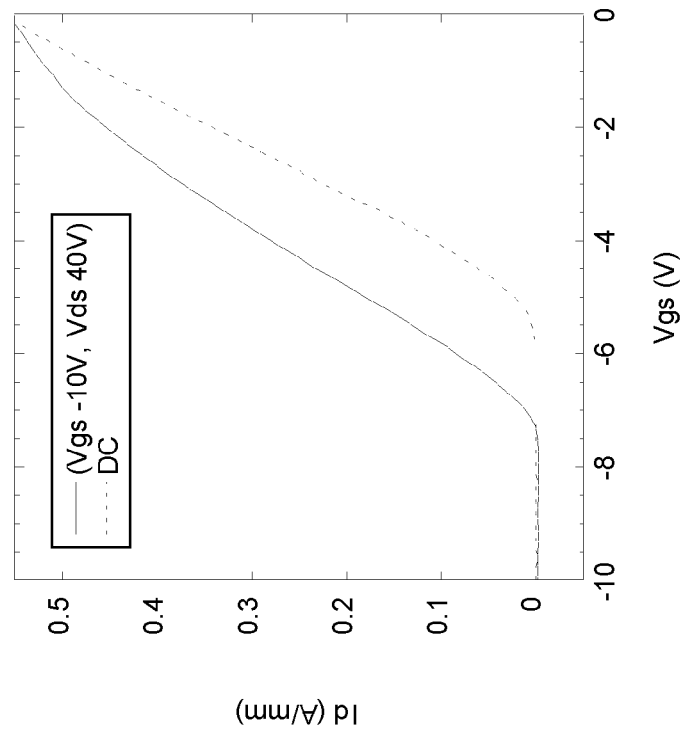

The higher quality of "HEMT B" with the 5 nm in-situ nitride and 10 nm ALD $Al_2O_3$ as gate dielectric in comparison to "HEMT A" with only 10 nm ALD $Al_2O_3$ as gate dielectric is demonstrated in the pulsed Id-Vgs characteristics shown in FIG. 4a for "HEMT A" and in FIG. 4b for "HEMT B". The graphs compare the DC behavior (dotted line) to pulsed characteristics from quiescent bias points, e.g. Vgs=−10V, Vds=40V quiescent bias points, for "HEMT A" and, respectively, bias points, e.g. Vgs=−5V, Vds=50V bias points, for "HEMT B" (full line). "HEMT A", processed in the conventional way, shows a Vth shift and current decrease under pulsed operation, while this is not the case for "HEMT B" processed using the method of the disclosure. This is believed to be related with the inferior quality AlGaN/$Al_2O_3$ interface and/or gate dielectric for "HEMT A", resulting in trapping under the gate.

Figure 5:
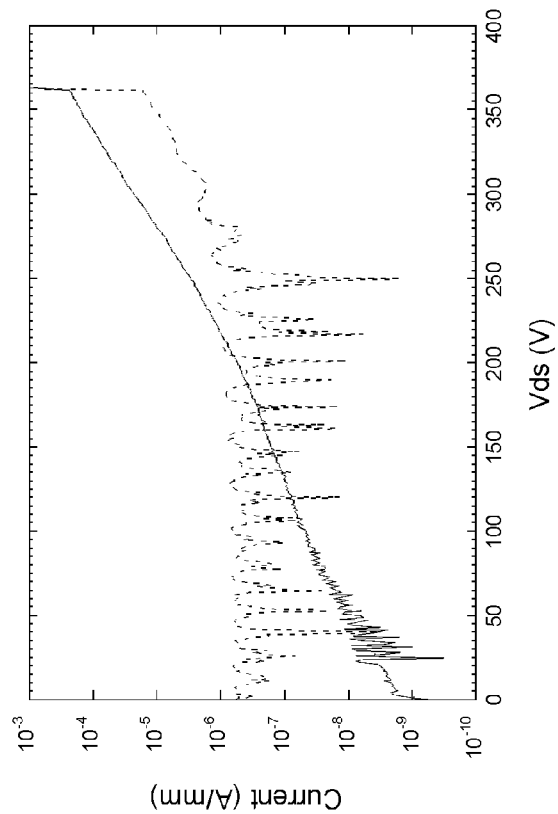
FIG. 5 shows the device breakdown in pinch-off: a) "HEMT A", b) "HEMT B".
Figure 5:
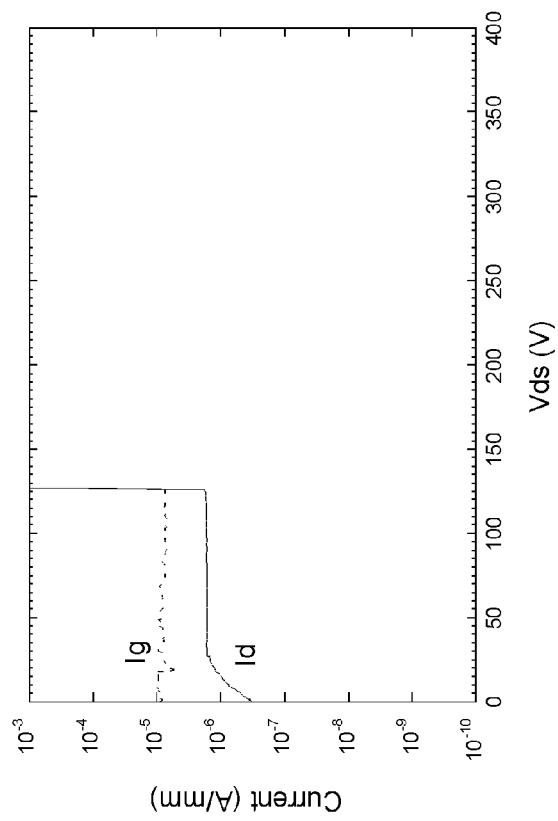

The device breakdown in pinch-off is compared in FIGS. 5a and 5b for devices "HEMT A" and "HEMT B", respectively. Gate trapping results in early device breakdown at 125V drain voltage due to gate oxide breakdown for "HEMT A". The device breakdown for "HEMT B" is improved to 400V. It is believed that this is related with the better quality of the gate dielectric when the combination of in-situ nitride with ALD $Al_2O_3$ is used.

To further illustrate the advantages, or preferred advantages, of the method of the disclosure and the device thereof we fabricated and evaluated another two types of AlGaN/GaN HEMTs using an $Al_2O_3$ gate dielectric. Both HEMTs were processed by CMOS-compatible processes using Au-free metal schemes, stepper lithography and metal patterning by dry etching. "HEMT C" uses the conventional method with a single ALD $Al_2O_3$ gate dielectric deposited after the gate recess of thick in-situ nitride. "HEMT D" is processed using the method of the disclosure with deposition of thin in-situ nitride, followed by ALD $Al_2O_3$ and LPCVD nitride deposition.

The fabrication of "HEMT C" comprises the following process steps, in sequence:

a) forming the AlGaN/GaN epilayer stack, grown on top of a Si(111) substrate, consisting of an AlN nucleation layer, followed by a 2.5 μm thick AlGaN buffer layer, a 150 nm thick GaN channel layer, a 10 nm 25% AlGaN barrier layer;

b) forming 120 nm in-situ silicon nitride passivation;

c) forming the Ohmic contacts by defining the Ohmic areas with stepper lithography and dry etching of the 120 nm in-situ nitride using a $SF_6$ plasma; deposition of a Ti/Al/W metal stack, stepper lithography, dry metal etching and alloy at 600° C.;

d) formation of a dielectric cap on top of the Ohmic areas by PECVD nitride deposition, stepper lithography and selective etching of the PECVD nitride towards the in-situ nitride;

e) device isolation;

g) gate trench etching using stepper lithography followed by dry etching of the 120 nm in-situ nitride using a $SF_6$ plasma;

f) wafer cleaning in a HCl/TMAH solution, immediately followed by the deposition of the 15 nm $Al_2O_3$ film and a 600° C. post-deposition annealing step;

g) gate metal formation by W/Ti/Al deposition, followed by stepper lithography and dry metal etching.

The fabrication of "HEMT D" comprises the following process steps, in sequence:

a) forming the AlGaN/GaN epilayer, grown on top of a Si(111) substrate, consisting of an AlN nucleation layer, followed by a 2.5 μm thick AlGaN buffer layer, a 150 nm thick GaN channel layer, a 10 nm 25% AlGaN barrier layer;

b) forming 10 nm in-situ silicon nitride passivation;

c) wafer cleaning in a HCl/TMAH solution, immediately followed by the deposition of the 5 nm $Al_2O_3$ film and a 700° C. post-deposition annealing step;

d) deposition of 120 nm LPCVD nitride at 800° C.;

e) ohmic contact formation by defining the Ohmic areas with stepper lithography, dry etching of the 120 nm LPCVD nitride using a $SF_6$ plasma, wet etching of the $Al_2O_3$ ALD film in 1% HF and dry etching of the 5 nm in-situ nitride using a $SF_6$ plasma. This was followed by the deposition of the Ti/Al/W metal stack, stepper lithography, dry metal etching and alloy at 600° C.

f) dielectric cap formation on top of the Ohmic areas by PECVD nitride deposition, stepper lithography and selective etching of the PECVD nitride towards the LPCVD nitride;

g) device isolation;

g) gate trench etching using contact lithography followed by dry etching of the 120 nm LPCVD nitride using a $SF_6$ plasma. The 5 nm ALD $Al_2O_3$ and the 10 nm in-situ nitride layer were not removed, resulting in a bilayer gate dielectric consisting of 10 nm in-situ nitride at the bottom and 5 nm Al2O3 on top.

The gate metal was formed by W/Ti/Al deposition, followed by stepper lithography and dry metal etching.

Figure 6:
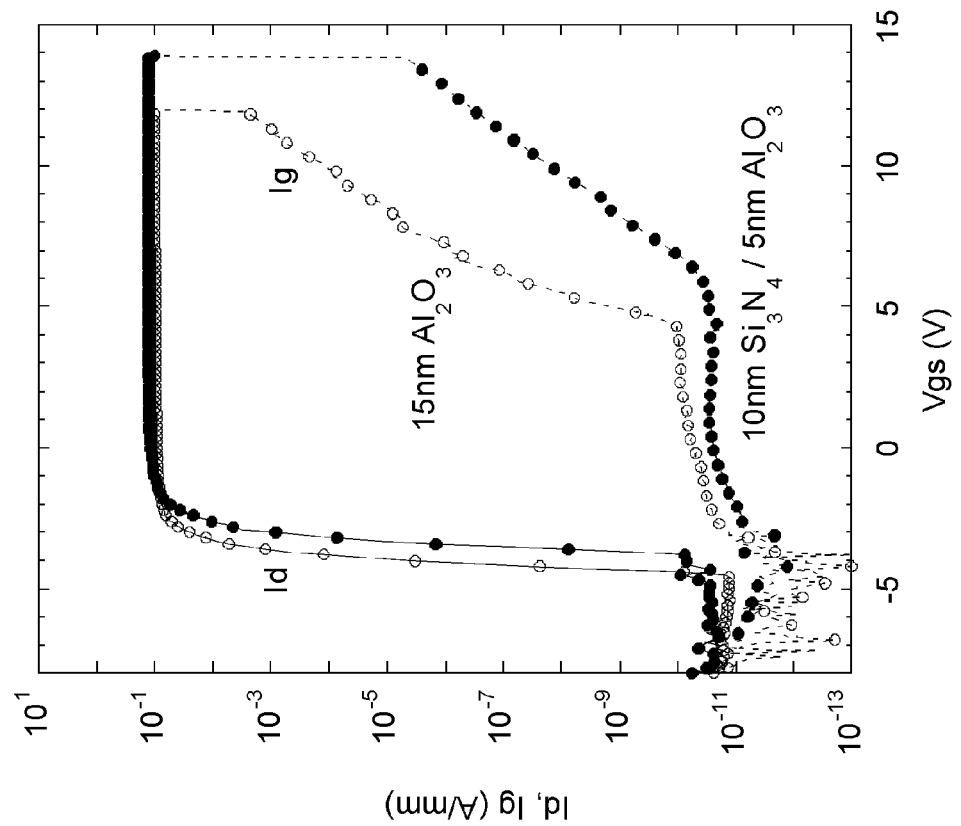
FIG. 6 shows the Id-Vgs and Ig-Vgs characteristics for "HEMT C" (open symbols) and "HEMT D" (full symbols).

The higher quality of "HEMT D" with the 10 nm in-situ nitride and 5 nm ALD $Al_2O_3$ as gate dielectric in comparison to "HEMT C" with only 15 nm ALD $Al_2O_3$ as gate dielectric is demonstrated in the Id-Vgs and Ig-Vgs characteristics at Vds=1V comparison shown in FIG. 6. The forwards gate bias gate leakage current Ig is about 2 orders of magnitude lower for "HEMT D".

Figure 7:
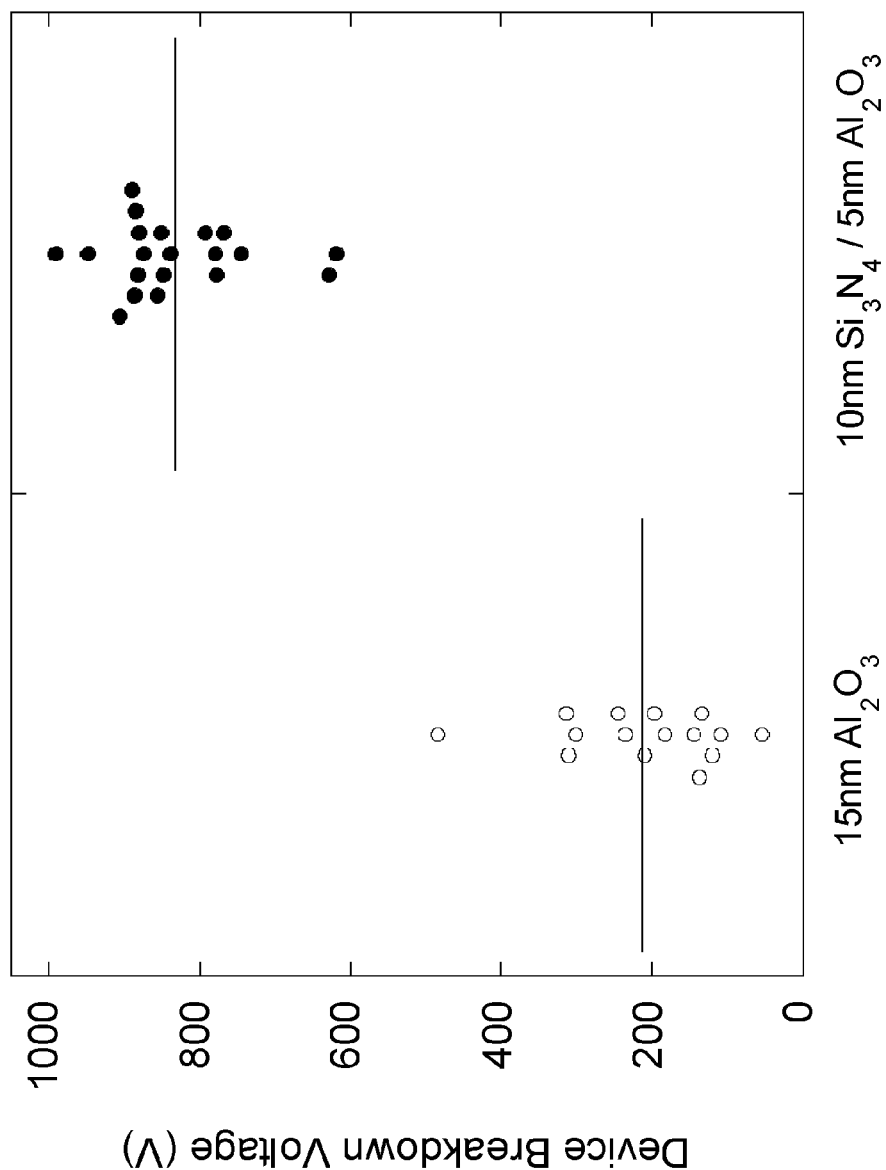
FIG. 7 shows the breakdown voltage distribution for "HEMT C" (open symbols) and "HEMT D" (full symbols).
Figure 8:
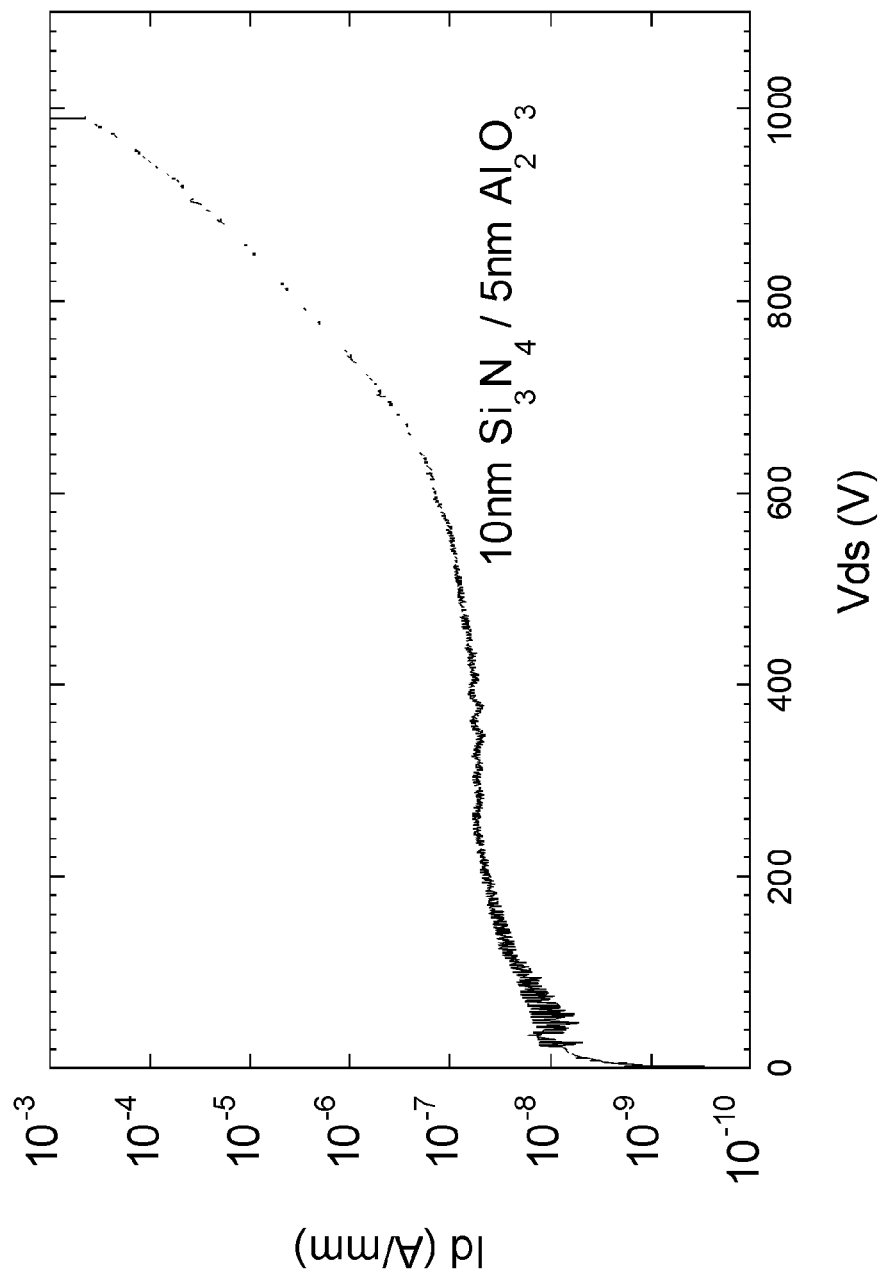
FIG. 8 shows the device breakdown in pinch-off for "HEMT D".
Figure 9:
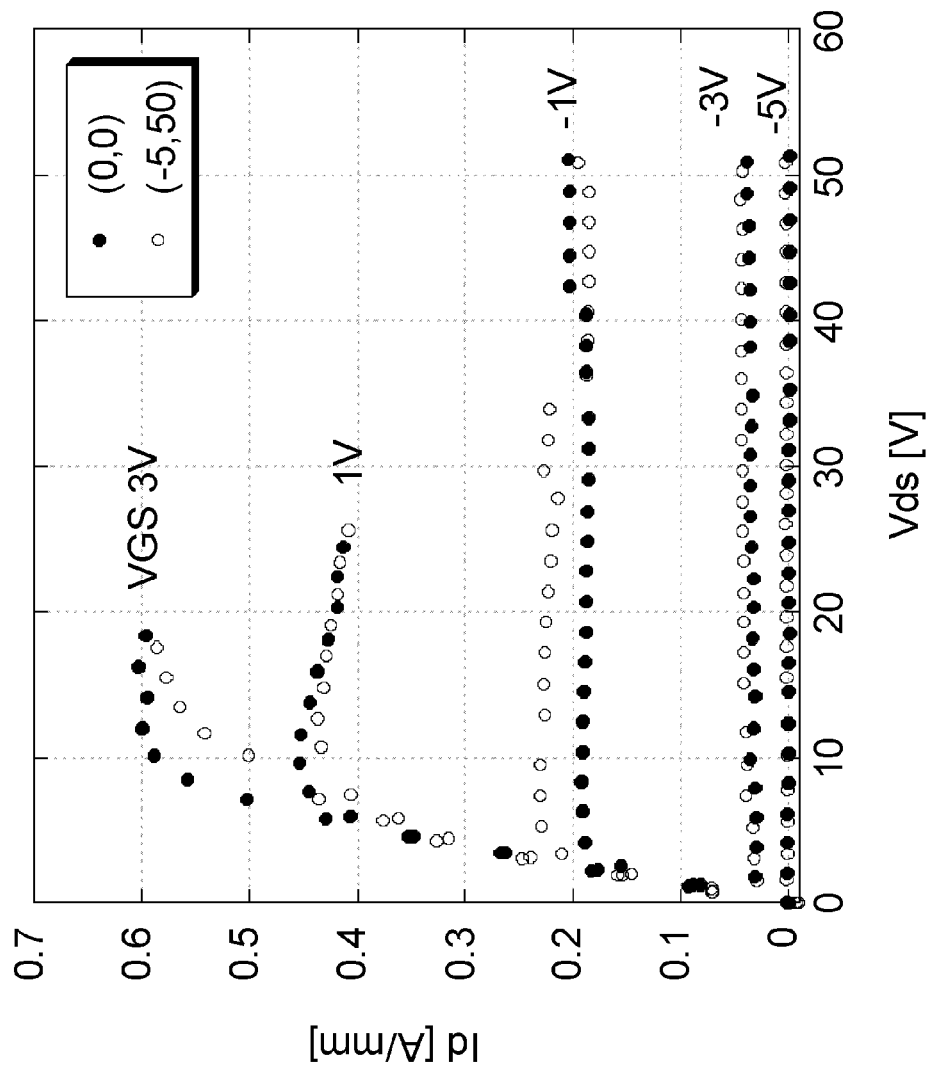
FIG. 9 shows the pulsed Id-Vds characteristics for "HEMT D".

The distribution over the full 150 mm wafer of the device breakdown in pinch-off is compared in FIG. 7 for "HEMT C" and "HEMT D". The better quality of the gate dielectric for "HEMT D" results in devices with a uniform high breakdown voltage. The average breakdown voltage is 800V for "HEMT D" while it is 200V for "HEMT C". A typical Id-Vds (Vgs=−8V) breakdown curve for "HEMT D" is shown in FIG. 9. The drain leakage is below 1 μA/mm till Vds ~700V.

FIG. 9 shows the dispersion behavior for "HEMT D". The graph compares the Id-Vds curves when pulsing from (Vds=0V, Vgs=0V) and (Vds=50V, Vgs=−5V) quiescent bias points. The observed current collapse is very limited.

What is claimed is:

1. A CMOS compatible Group III-nitride HEMT device, formed on an active area of a substrate, comprising:
    a gate electrode comprises a metal gate electrode in a trench;
    source and drain contacts;
    the substrate;
    a stack of Group III-nitride layers on the substrate;
    a first passivation layer comprising silicon nitride, preferably $Si_3N_4$, and in contact with an upper layer of the stack of III-nitride layers everywhere on the active area except under the source and drain contacts;
    an dielectric layer overlying and in contact with the first passivation layer everywhere on the active area except under the source and drain contacts, the dielectric film comprising a high-k dielectric material;
    a second passivation layer comprising silicon nitride, preferably $Si_3N_4$, overlying and in contact with the dielectric layer everywhere on the active area except under at least a part of the gate electrode and under the source and drain contacts;
    wherein the source and drain ohmic contacts comprises an ohmic alloy of Au-free metal layer formed at a temperature between 500° C. and 850° C. and below a crystallization temperature of the high-k dielectric material; and
    a gate dielectric comprising the first passivation layer and at least part of the dielectric layer, wherein the second passivation layer is thinner in an exposed region between an edge of the metal gate electrode and the source and drain contacts when compared to an original thickness as-deposited in regions covered by the metal gate electrode.

2. The device of claim 1, wherein the silicon nitride is deposited at a temperature between 900° C. and 1250° C. by a chemical vapor deposition technique.

3. The device of claim 2, wherein the chemical vapor deposition technique is selected from the group consisting of low pressure chemical vapor deposition and metal organic chemical vapor deposition.

4. The device of claim 1, wherein the silicon nitride of the second passivation layer contains 3-8% H and has a density of about 2.9-3.1 $g/cm^3$.

5. The device of claim 1, wherein the dielectric layer comprises multiple layers.

6. The device of claim 1, wherein the dielectric layer comprises Al.

7. The device of claim 6, wherein the dielectric layer comprises $Al_2O_3$ and/or AlN.

8. The device of claim 1, wherein the first passivation layer has a thickness of at least 0.5 nm.

9. The device of claim 1, wherein the second passivation layer has a thickness of at least 50 nm.

* * * * *